(12) United States Patent
Shiu (10) Patent No.: US 10,607,977 B2
(45) Date of Patent: Mar. 31, 2020

(54) INTEGRATED DRAM WITH LOW-VOLTAGE SWING I/O

(71) Applicant: Google LLC, Mountain View, CA (US)

(72) Inventor: Shinye Shiu, Los Altos, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/787,217

(22) Filed: Oct. 18, 2017

(65) Prior Publication Data

US 2018/0211946 A1 Jul. 26, 2018

Related U.S. Application Data (60) Provisional application No. 62/448,895, filed on Jan. 20, 2017.

(51) Int. Cl.
*H01L 25/18* (2006.01)
*H01L 21/66* (2006.01)
(Continued)

(52) U.S. Cl.
CPC ............ *H01L 25/18* (2013.01); *G11C 5/04* (2013.01); *G11C 5/063* (2013.01); *G11C 5/14* (2013.01); *G11C 11/34* (2013.01); *G11C 29/48* (2013.01); *H01L 21/4853* (2013.01); *H01L 21/4857* (2013.01); *H01L 21/78* (2013.01); *H01L 22/14* (2013.01); *H01L 22/32* (2013.01); *H01L 23/5386* (2013.01); *H01L 24/16* (2013.01);
(Continued)

(58) Field of Classification Search
CPC . H01L 25/18; H01L 21/4853; H01L 21/4857; H01L 21/78; H01L 22/14; H01L 22/32; G11C 5/04; G11C 5/063; G11C 5/14
See application file for complete search history.

(56) References Cited

U.S. PATENT DOCUMENTS

2007/0070669 A1* 3/2007 Tsern ............... G11C 5/02
365/51
2007/0187814 A1 8/2007 Cusack et al.
(Continued)

FOREIGN PATENT DOCUMENTS

CN 105529324 4/2016
TW 201613067 4/2016
(Continued)

OTHER PUBLICATIONS

Mu-Shan Lin; A 1 Tbit/s Bandwidth 1024 b PLL/DLL-Less eDRAM PHY Using 0.3 V 0.105 mW/Gbps Low-Swing IO for CoWoS Application; IEEE Journal of Solid-State Circuits (vol. 49, Issue: 4, Apr. 2014) (Year: 2014).*

(Continued)

*Primary Examiner* — Mark W Tornow
(74) *Attorney, Agent, or Firm* — Colby Nipper PLLC (57) ABSTRACT

This document describes apparatuses and techniques for integrated DRAM with low-voltage swing I/O. In some aspects, a dynamic random access memory (DRAM) die and application processor (AP) die are mounted to a system-in-package (SiP) die carrier that includes one or more redistribution layers. The DRAM die and AP die are located adjacent to each other on the die-carrier such that respective memory inputs/outputs of each die are proximate the other inputs/outputs.

20 Claims, 10 Drawing Sheets

(51) Int. Cl.
　　　H01L 23/00　　　　(2006.01)
　　　H01L 25/065　　　 (2006.01)
　　　G11C 29/48　　　　(2006.01)
　　　G11C 5/06　　　　 (2006.01)
　　　G11C 5/14　　　　 (2006.01)
　　　G11C 5/04　　　　 (2006.01)
　　　G11C 11/34　　　　(2006.01)
　　　H01L 21/48　　　　(2006.01)
　　　H01L 21/78　　　　(2006.01)
　　　H01L 23/538　　　 (2006.01)
　　　H01L 25/00　　　　(2006.01)
　　　G11C 11/4093　　　(2006.01)
　　　G11C 7/10　　　　 (2006.01)

(52) U.S. Cl.
　　　CPC .......... *H01L 24/48* (2013.01); *H01L 25/0655* (2013.01); *H01L 25/0657* (2013.01); *H01L 25/50* (2013.01); *G11C 7/1075* (2013.01); *G11C 11/4093* (2013.01); *H01L 23/5383* (2013.01); *H01L 24/06* (2013.01); *H01L 24/13* (2013.01); *H01L 24/17* (2013.01); *H01L 24/73* (2013.01); *H01L 24/81* (2013.01); *H01L 2224/0401* (2013.01); *H01L 2224/04042* (2013.01); *H01L 2224/06135* (2013.01); *H01L 2224/13147* (2013.01); *H01L 2224/16225* (2013.01); *H01L 2224/16227* (2013.01); *H01L 2224/17517* (2013.01); *H01L 2224/32145* (2013.01); *H01L 2224/48091* (2013.01); *H01L 2224/48137* (2013.01); *H01L 2224/48145* (2013.01); *H01L 2224/73265* (2013.01); *H01L 2224/81203* (2013.01); *H01L 2224/81815* (2013.01); *H01L 2225/06506* (2013.01); *H01L 2225/06562* (2013.01); *H01L 2225/06596* (2013.01); *H01L 2924/1431* (2013.01); *H01L 2924/1434* (2013.01); *H01L 2924/1436* (2013.01); *H01L 2924/157* (2013.01); *H01L 2924/15192* (2013.01)

(56)　　　　　　References Cited

U.S. PATENT DOCUMENTS

| 2010/0091537 | A1* | 4/2010 | Best | G11C 5/02 |
| | | | | 365/51 |
| 2012/0326282 | A1 | 12/2012 | Sutardja | |
| 2014/0264906 | A1 | 9/2014 | Fai et al. | |
| 2016/0086920 | A1 | 3/2016 | Yoon | |
| 2017/0040041 | A1* | 2/2017 | Song | G11C 5/147 |

FOREIGN PATENT DOCUMENTS

| TW | 201639110 | 11/2016 |
| WO | 2018136124 | 7/2018 |

OTHER PUBLICATIONS

"International Search Report and Written Opinion", PCT Application No. PCT/US2017/058087, dated Jan. 24, 2018, 15 pages.

"Foreign Office Action", TW Appilcation No. 106137284, dated Jul. 2, 2018, 13 pages.

"Written Opinion", PCT Application No. PCT/US2017/058087, dated Oct. 9, 2018, 7 pages.

Lin, et al., "A 1 Tbit/s Bandwidth 1024 b PLL/DLL-Less eDRAM PHY Using 0.3 V 0.105 mW/Gbps Low-Swing IO for CoWoS Application", IEEE Journal of Solid-State Circuits, vol. 49, No. 4, Apr. 2014, Apr. 2014, 12 pages.

"Foreign Office Action", TW Application No. 106137284, dated Mar. 12, 2019, 4 pages.

"International Preliminary Report on Patentability", PCT Application No. PCT/US2017/058087, dated Aug. 1, 2019, 8 pages.

\* cited by examiner

INTEGRATED DRAM WITH LOW-VOLTAGE SWING I/O

BACKGROUND

Computing devices include various types of memory to which data is written or from which data is read. Many types of conventional memory, however, are optimized for density efficiency (e.g., raw capacity) instead of size, cost, power, or other aspects of memory performance. As such, these types of conventional memory are typically ill suited for use in mobile devices where cost, size, and power are often critical design or manufacturing constraints.

SUMMARY

This disclosure describes apparatuses and techniques for implementing integrated dynamic random access memory (DRAM) with low-voltage swing input/output (I/O). A dynamic random access memory (DRAM) die and application processor (AP) die are implemented on a system-in-package (SiP) die carrier that includes one or more redistribution layers. In some cases, the DRAM die and AP die are placed adjacent to each other on the die carrier such that respective data inputs/outputs of each die are proximate. This summary is provided to introduce simplified concepts concerning integrated DRAM with low-voltage swing I/O, which is further described below in the Detailed Description. This summary is not intended to identify essential features of the claimed subject matter, nor is it intended for use in determining the scope of the claimed subject matter.

BRIEF DESCRIPTION OF THE DRAWINGS

Embodiments of DRAM with low-voltage swing I/O are described with reference to the following drawings. The same numbers are used throughout the drawings to reference like features and components.

DETAILED DESCRIPTION

Overview

For most devices, particularly for high performance devices, inserting memory inline, such as cache memory, with an application processor (AP) can improve latency and bandwidth. When in the mobile space these and similar solutions, such as conventional techniques using embedded dynamic random access memory (eDRAM) or high bandwidth memory (HBM) with through silicon via (TSV) packaging technologies, are too costly.

The aspects described in this disclosure provide memory with latency, bandwidth, or cost improvements, which may be suitable for deployment in mobile spaces. In some cases, a dynamic random access memory (DRAM) die and application processor (AP) die are mounted onto a die carrier having redistribution layers (RDLs). The die carrier, used in assembly of a System-in-Package (SiP) component, includes pads that position the DRAM die and AP die adjacent to each other such that respective data inputs/outputs of each die are proximate.

These are but a few examples of ways in which DRAM with low-voltage swing I/O can be implemented, which are described herein. The following discussion first describes an operating environment, followed by techniques that may be employed in this environment, and ends with example systems.

Operating Environment

Figure 1:
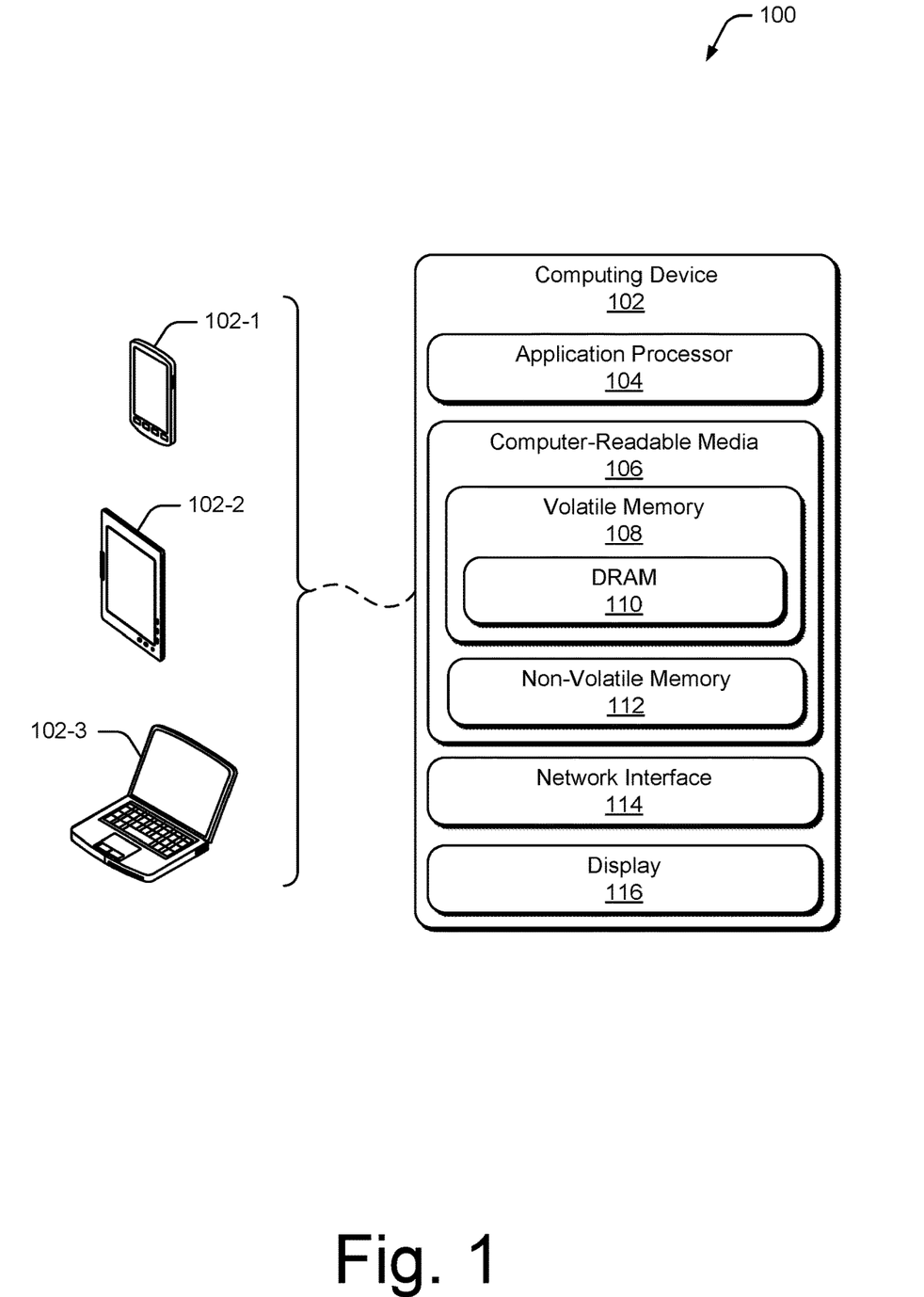
FIG. 1 illustrates an example environment that includes a computing device having an application processor and DRAM memory.

FIG. 1 illustrates an example environment 100 that includes a computing device having an application processor and DRAM memory. Computing device 102 is illustrated with various non-limiting example devices, a smartphone 102-1, a tablet 102-2, and a laptop computer 102-3, though other devices may also be used, such as home automation and control systems, smart-watches, entertainment systems, wearable computers, Internet-of-Things devices, audio systems, other home appliances, security systems, netbooks, automobiles, smart-appliances, and e-readers. Note that the computing device 102 can be wearable, non-wearable but mobile, or relatively immobile (e.g., desktops and appliances).

The computing device 102 includes one or more application processor die 104 and computer-readable media 106 (CRM 106), which includes a volatile memory 108 and a non-volatile memory 112. Applications and/or an operating system (not shown) embodied as computer-readable instructions on computer-readable media 106 can be executed by application processor die 104 to enable various functionalities of the computing device 102.

In some aspects, the application processor 104 and CRM 106, as dynamic random access memory (DRAM) 110 or other memory types, are implemented as an integrated system-in-package (SiP) component. For example, the application processor and DRAM can be dies, or chips, mounted onto a die carrier, of a system-in-package (SiP) component, via microbumps. In the case of the SiP, the application processor die and DRAM die may be connected via a redistribution layers (RDL) of the die carrier, where the RDL serves to connect integrated circuitry of the application processor die and the DRAM die.

The computing device 102 may also include one or more network interfaces 114 for communicating data over wired, wireless, or optical networks and a display 116. The network interface 114 may communicate data over a local-area-network (LAN), a wireless local-area-network (WLAN), a personal-area-network (PAN), a wide-area-network (WAN), an intranet, the Internet, a peer-to-peer network, point-topoint network, a mesh network, and the like. The display 116 can be integral with the computing device 102 or associated with it, such as with a gaming system or set-top box.

Figure 2:
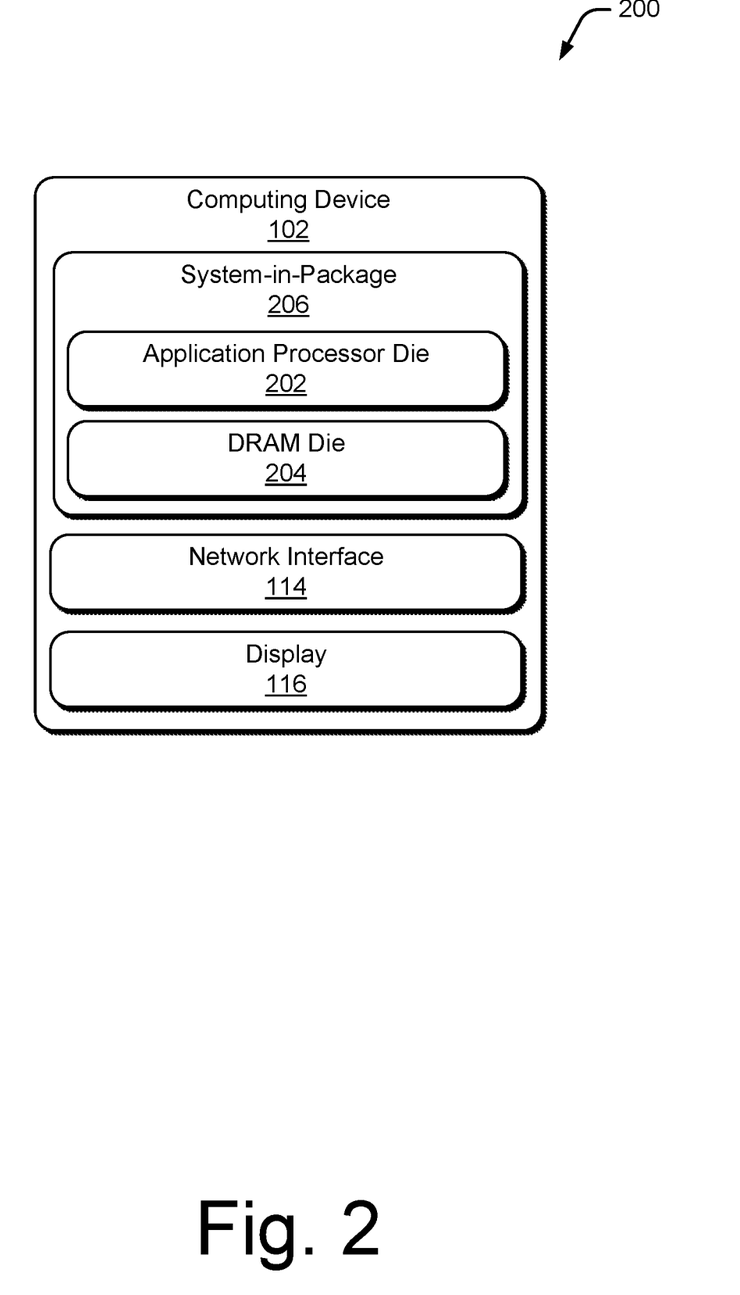
FIG. 2 illustrates an example configuration of the application processor and DRAM memory shown in FIG. 1.

FIG. 2 illustrates an example configuration 200 of the application processor and DRAM memory shown in FIG. 1. In this example, an application processor (AP) die 202 and CRM, here shown as DRAM die 204, are implemented as a system-in-package (SiP) 206. Although shown as separate, the network interface 114 and/or a controller for the display 116 may also be implemented in whole or part within the system-in-package 206 and/or with components thereof (e.g., a baseband processor or graphics processor).

With respect to integrating the application processor die 202 and the DRAM die 204, any suitable type of data bus or configuration may be implemented. In some aspects, a high data rate of third generation low-power double data rate random access memory (LPDDR3) having wide data width supporting a Wide I/O2 (WIO2) compatible data bus are combined in a custom DRAM die (e.g., 1Gb) to provide up to 68 GB/s peak bandwidth. This design can be constructed for use where the DRAM die 204 and AP die 202 are placed side-by-side in the system-in-package (SiP) 206 and interface with Low Voltage Swing IOs (LVSIO). This may be effective to allow the full optimization of the 68 GB/s while controlling power consumption of the DRAM die 204 and the AP die 202. Streamlined data flow, organized as compact bit slices, may also reduce parasitic capacitance and dynamic power. In some cases, this aids in attaining in 20 mW/GBps in a seam-less read mode. The dual chip design may, in some instances, be implemented with an Integrated Fan-Out Wafer Level Packaging (InFOWLP) technique which results in low capacitance interconnections and efficiently distributed power delivery networks.

In some aspects, the DRAM die 204 is designed and constructed on a 30 nm process technology for fabricating semiconductor wafers, with key features of the Wide I/O2 and LPDDR3 specifications or protocols. The process technology used to fabricate semiconductor wafers of the DRAM die 204 may not match the process technology used to fabricate semiconductor wafers of a corresponding AP die of the SiP.

The DRAM die 204 may include four independent channels, each supporting an 8 byte wide data I/O and each with a separate power distribution network (PDN). The die floor-plan can be bit-slice oriented to minimize on-chip Global data read/write (GDRW) routes to improve performance and power. In some cases, edge micro-bumps are used to facilitate low Re-Distribution Layer (RDL) interconnect capacitance between the DRAM die and AP. These micro-bumps may be implemented using any suitable process, size, and/or pitch, such as at pitches less than ~50 μm and/or with heights of ~40 μm. Alternately or additionally, the microbumps can be implemented with Copper (Cu) Pillar micro-bump or thermal compression with non-conductive paste (TCNCP) technologies. In order to reduce the interface power with high IO count, the Low Voltage Swing Input/Output (e.g., JESD8-38) can be utilized to implement an interface between the DRAM die 204 and the AP die 202, or other components. The output stage logic power voltage (VCCQ) potential of the DRAM die 204 or AP die 202 can be driven by an applied load of approximately 0.3 volts and/or implemented without termination (e.g., resistors or capacitors) between the two dies (or chips). In at least some aspects, the dies and die carrier are implemented directly, without interposer layers and/or through silicon vias, thereby enabling low capacitance interconnects and higher operating frequencies and/or transfer bandwidth.

The DRAM die 204 may also include other features, such as WIO2-like Data Bus Inversion (DBIac) to reduce simultaneous switching output (SSO) noise, Boundary Scan (BSCAN) for contactless testing of micro bumps, on-die reference voltage generation with trimming as proposed on LPDDR4X or other advanced memory specifications, reduction of key row timings to address system random access cycle, and several test options to validate the high performance targets. Table 1 compares the features of this custom design with existing DRAM protocols.

TABLE 1

| Items | LPDDR3 | WIO2 | Custom |
|---|---|---|---|
| MAX DR | 2133 Mbps | 800 Mbps | 2133 Mbps |
| DBI | no | yes - Dblac | yes - Dblac |
| BSCAN | no | yes - Dblac | yes - Dblac |
| VCCQ (V) | 1.2 | 1.2 | 0.3 |
| CHANNEL I/O | X32 | X64 | X64 |
| CIO (pF) | 5 | 1.4 | 0.3 |
| CHANNELS | 1 | 4 | 4 |
| CHIP I/Os | 32 | 256 | 256 |
| 2.5/3D PKG | no | yes (TSV) | yes (ubump) |
| VREF FOR CA | ext | ext | int |
| VRDEF FOR DQ | ext | ext | int |
| INPUT VSW | 1.2 | 1.2 | 0.3 |
| ON CHIP TEST | no | yes | yes |

In some cases, the 64 Mb banks in each channel are configured as 4 k row depth by 2 kB page. Each access can provide an 8 b pre-fetch for 64IOs controlled by column addresses (CA)<7:0.

Power dissipation of the DRAM 204 die can be optimized by using a ~300 mV LVSIO design and/or minimizing the high speed data path routes. Alternately or additionally, the latter can be met by using a compressed, bit-slice data-path that keeps the GDRW lines to a minimum. By way of example, a 30 nm design has a measured Idd4r2 in seam-less read mode of ~275 mA/channel, or 20 mW/GBps, approximately half the energy per bit of standard LPDDR4 designs. An LVSIO design reduce power and improve performance, but the ~300 mV un-terminated IO interface can results in a small data eye. To help reduce SSO eye degradation that may arise on a 512 b wide IO bank, a DBIac algorithm can be implemented. This DBIac algorithm may be implemented similar to those of the WIO2 specification due to the un-terminated IOs or interface. In some cases, tight pitch of the bit lanes helps reduce wiring capacitance associated with calculating the DBIac. The 8-bit pre-fetch, however, may increase the calculation time for the DBIac algorithm when compared to WIO2. Mask Write command may also be added to provide an enablement of the dual function direct data bus (DMI) pin.

Figure 3:
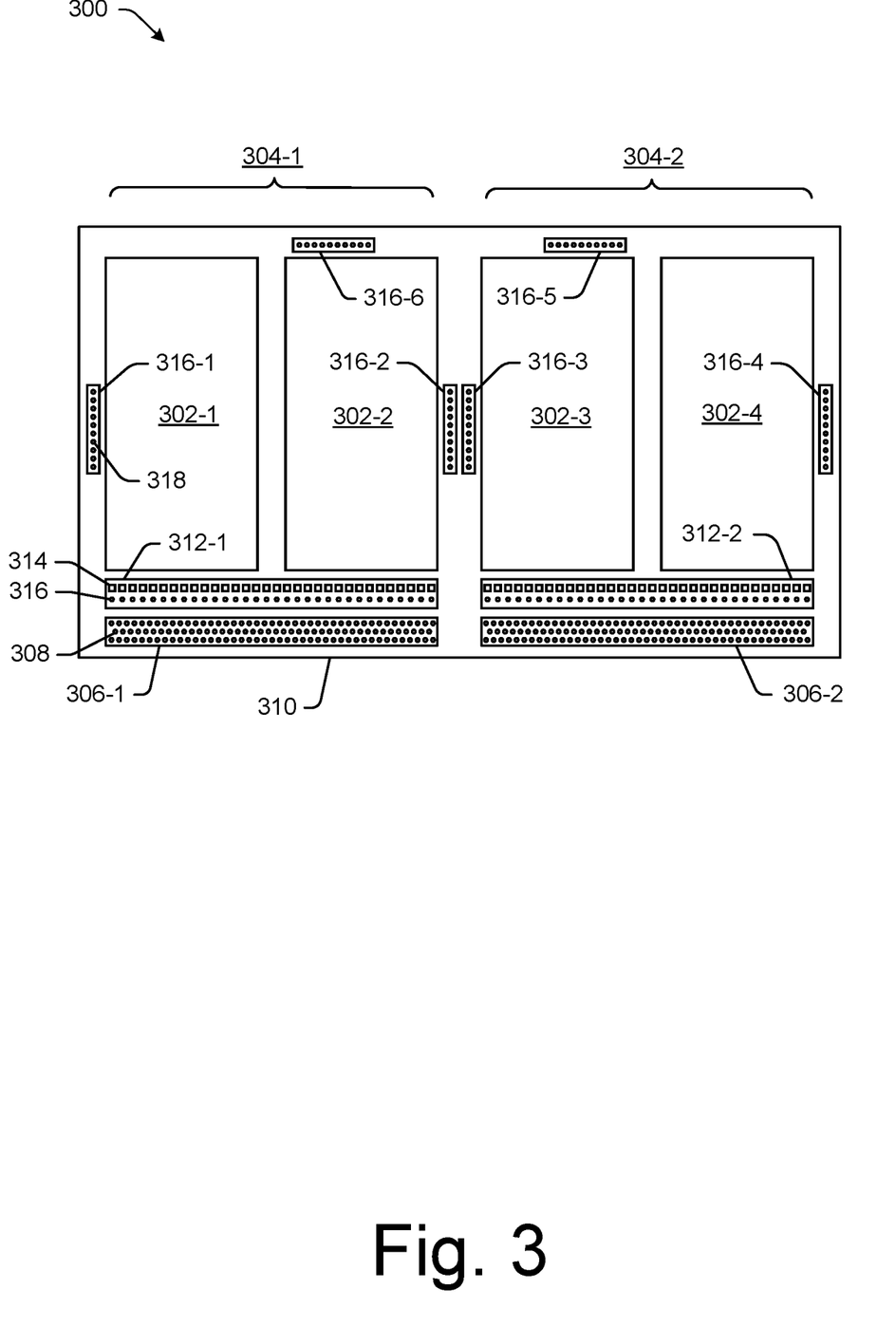
FIG. 3 illustrates an example floor-plan of a DRAM die implemented in accordance with one or more aspects.

FIG. 3 illustrates an example floor-plan 300 of a DRAM die implemented in accordance with one or more aspects. The floor-plan 300 of a DRAM die, such as the DRAM die 204 of FIG. 2, supports a 4 channel chip architecture, each channel having one 64 Mb bank (302-1 through 302-4). The floor-plan 300 supports two identical dual-channels, 304-1 and 304-2, each fully autonomous for typical DRAM operations. The DRAM die may include Low Voltage Swing Input/Output (LVSIO) circuitry, inclusive of drivers, sense-amps, or the like, as necessary to access data and communicate data via inputs/outputs of the die. As illustrated, the floor-plan 300 illustrates fields of Low Voltage Swing Inputs/Outputs (LVSIOs) 306-1 and 306-2, respectively shared by dual-channels 304-1 and 304-2.

In this particular example, the respective shared fields of LVSIOs 306-1 and 306-2 are each are comprised of 128 microbumps, such as microbump 308, which support data I/O that is 16 bytes wide for each dual channel (effective to support a 32 byte wide data bus from the DRAM die). The fields of LVSIOs 306-1 and 306-2 (e.g., microbumps) are located at, or proximate, the edge 310 of the DRAM die. Locating the fields of LVSIOs 306-1 and 306-2 at, or proximate, the edge 310 of the DRAM die affords incorporating the DRAM die into a system-in-package (SiP) design that incorporates a data bus having reduced parasitics and that is optimized for performance.

The floor-plan 300 also includes fields of test pads and power microbumps, shared, respectively, by the dual channels 304-1 and 304-2. In this particular example, the respective shared fields 312-1 and 312-2 of test pads and power microbumps are each comprised of a plurality of test pads, such as test pad 314, and a plurality of power microbumps, such as microbump 316.

The plurality of test pads is configured to support testing of the DRAM die (via a semiconductor wafer probe pin or other electrical contact). The test pads may be metallic and enable test coverage for this design (e.g., a custom memory design) in order to cover the standard array defects, validate the high speed paths and verify the feature set, while keeping test costs in line with other memory products. Test flow can be very critical for this design, and these test pads may enable the use of standard test fixtures, algorithms, or other procedures. Test data, collected via the test pads, may be used to aid in selection of a die during assembly Wafer probing capabilities and DRAM circuitry functionality may influence arrangement of the test pads. For example, each 8-byte channel of the DRAM may have one byte of test data lines (DQs) with a single command/address (CA) pad set shared between a dual-channel. This may allow the testing to be completed on a single channel, dual channel, or full chip with a reasonable probe count, thereby reducing quantity and/or location of test pads. The single test byte within a channel may be the broadcast to all 8 bytes in write mode and each of the 8 bytes can be serially sent compressed to the test byte in a read. As another example, DRAM circuitry supporting Built in Self-Test (BIST), data compression, and the like can reduce quantity of test pads required. Testing can exercise the entire data flow at maximum product speed at wafer test with the standard product circuit path, with the possible exception of the IB and Off Chip Driver (OCD).

The plurality of power microbumps is configured to connect to a power source supplying power to internal voltage generators and charge pumps of the DRAM die to support the array operations. Placement of the power microbumps, relative to the DRAM die floorplan, can be impact tFAW and tRDD timings and also help manage the high current demand regions by reducing, for example, current-resistance (IR) drops to key generators, pumps, and circuits.

Continuing with FIG. 3, the floor-plan 300 also includes other fields including microbumps that aid in mounting the DRAM die to a die carrier, such as fields of outrigger microbumps 316-1 through 316-6. Each outrigger microbump, such as outrigger microbump 318, may or may not provide additional electrical connectivity.

Figure 4:
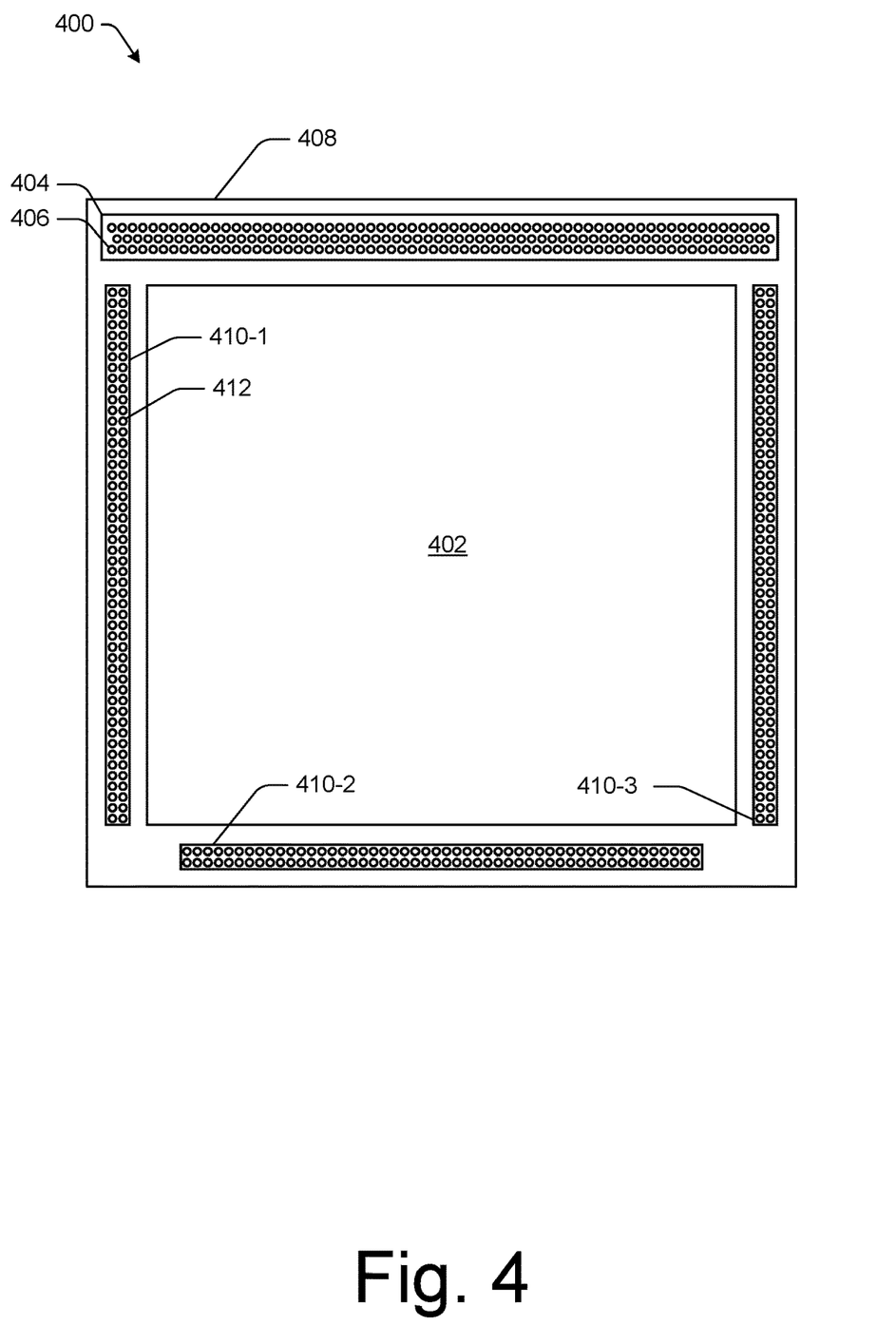
FIG. 4 illustrates an example floor-plan of an AP die implemented in accordance with one or more aspects.

FIG. 4 illustrates an example floor-plan 400 of an AP die implemented in accordance with one or more aspects. The AP die may include Low Voltage Swing Input/Output (LVSIO) circuitry, inclusive of drivers, logic, or the like, as necessary to process data and communicate data via data inputs/outputs of the AP die. In the example, the floor-plan 400 of the AP die, such as the AP die 202 of FIG. 2, supports a processing core 402 having Low Voltage Swing Input/Output (LVSIO) circuitry. The floor-plan 400 supports transmission and receipt of data via a field of LVSIOs 404 comprised of microbumps, such as microbump 406. In this particular example, the field of LVSIOs 404 includes 256 microbumps in order to support a data bus that is 256 bits wide. As illustrated by the floor-plan 400, the field of LVSIOs 404 (e.g., microbumps) is located at, or proximate, the edge 408 of the AP die. Locating the field of LVSIOs 404 at, or proximate, the edge 408 of the AP die affords incorporating the AP die into a system-in-package (SiP) design that incorporates a data bus having reduced parasitics and that is optimized for performance.

The AP die also includes interconnect fields 410-1 through 410-3. The fields of interconnects 410-1 through 410-3 include microbumps, such as microbump 412, and serve as additional connections, either electrical or mechanical in nature, to the die carrier.

Figure 5:
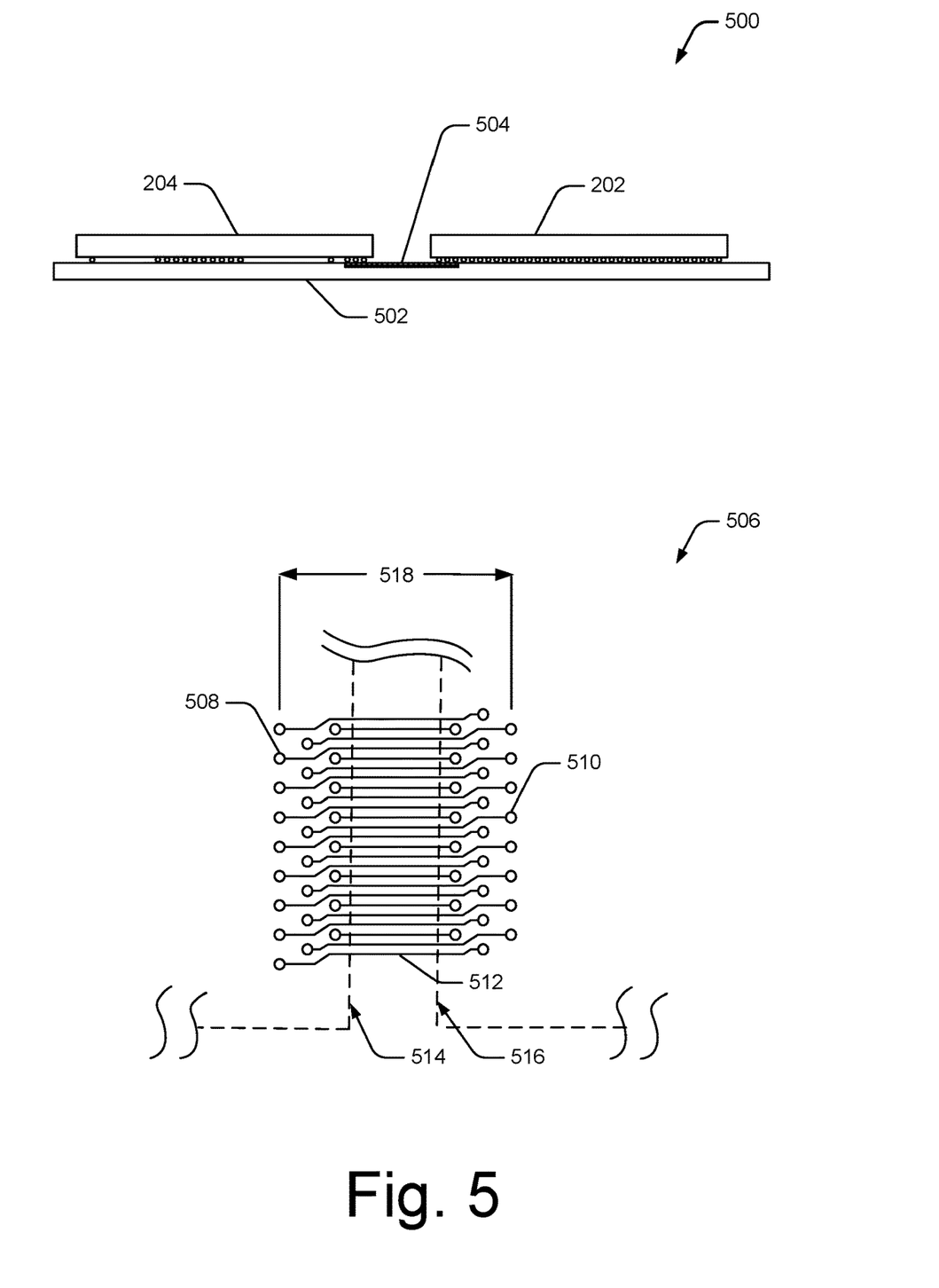
FIG. 5 illustrates details of a die carrier to which an example DRAM die and an example AP are mounted.

FIG. 5 illustrates details of a die carrier to which an example DRAM die and an example application processor die are mounted. In some aspects, the redistribution layer includes a plurality of un-terminated traces that provide a data bus between LVSIOs of the DRAM die and the application processor (AP) die.

Configuration 500 illustrates a side view exemplifying DRAM die 204 and AP die 202 of FIG. 2 mounted to an example die carrier 502. Die carrier 502 may be fabricated using fan-out wafer-level packaging (INFO-WLP) techniques that utilize multiple layers of RDL. At least one layer of the multiple layers of RDL, RDL 504, provides electrical connectivity, serving as an un-terminated interface, between the DRAM die 204 and the AP die 202. DRAM die 204 and AP die 202 may be mounted to the die carrier, via pads defined by the RDL 504, using microbumps.

View 506 illustrates a magnified top view of a portion of RDL 504 (not to scale). The view includes a first plurality of pads, such as pad 508, a second plurality of pads, such as pad 510, and a plurality of traces, such as trace 512. Also illustrated is a boundary 514 for placement of DRAM die 204 (corresponding to edge 310 of FIG. 3) oriented adjacent to a boundary 516 for placement of AP die 202 (corresponding to edge 408 of FIG. 4). The first plurality of pads serves to mount, via microbumps, one or more fields of data I/O's of the DRAM die 204 (e.g., the fields of data I/O's 306-1 and fields 306-2 of FIG. 3) to the die carrier 502. The second plurality of pads serves to mount, via microbumps, a field of data I/O's of the AP die 202 (e.g., the field of LVSIOs 404) to the die carrier 502.

The plurality of traces serves as an un-terminated interface that transmits signals between LVSIOs of DRAM die 204 and LVSIOs of AP die 202. In general, architectures of the DRAM die 204, AP die 202, and die carrier 502 are combined such that a distance 518 between RDL pads is optimized, resulting in trace lengths that are less than 530 um and effective to reduce parasitics of and optimize performance of a system in package (SiP) utilizing the combined architectures. Also, note that any individual I/O would, by definition, be contained within a proximity of less than 530 um from the die edge in order to avoid physical interferences of die when being mounted to the RDL pads. For example, it may be possible to have an individual I/O of a DRAM die be 100 um from the edge of the DRAM die, while a corresponding, individual I/O of an AP die is 400 um from the edge of the AP die, but still maintain a trace length that is less than 530 um.

Die carrier 502 may also include additional, dedicated redistribution layers. For example, die carrier 502 may include an RDL (not illustrated) that is dedicated as a power plane, serving as a power connection for microbumps, such as microbump 318 of FIG. 3 or microbump 412 of FIG. 4. An additional redistribution layer dedicated as a power plane may support a more robust power distribution network (PDN) by strategic placement of power interconnects, effective to reduce the current-resistance (IR) drops to key generators, pumps, and circuits. Independent banks of a DRAM die, such as banks 302-1 through 302-4 as illustrated in the floor-plan 300 of the DRAM die illustrated in FIG. 3, may each be powered by an associated power distribution network (PDN).

Figure 6:
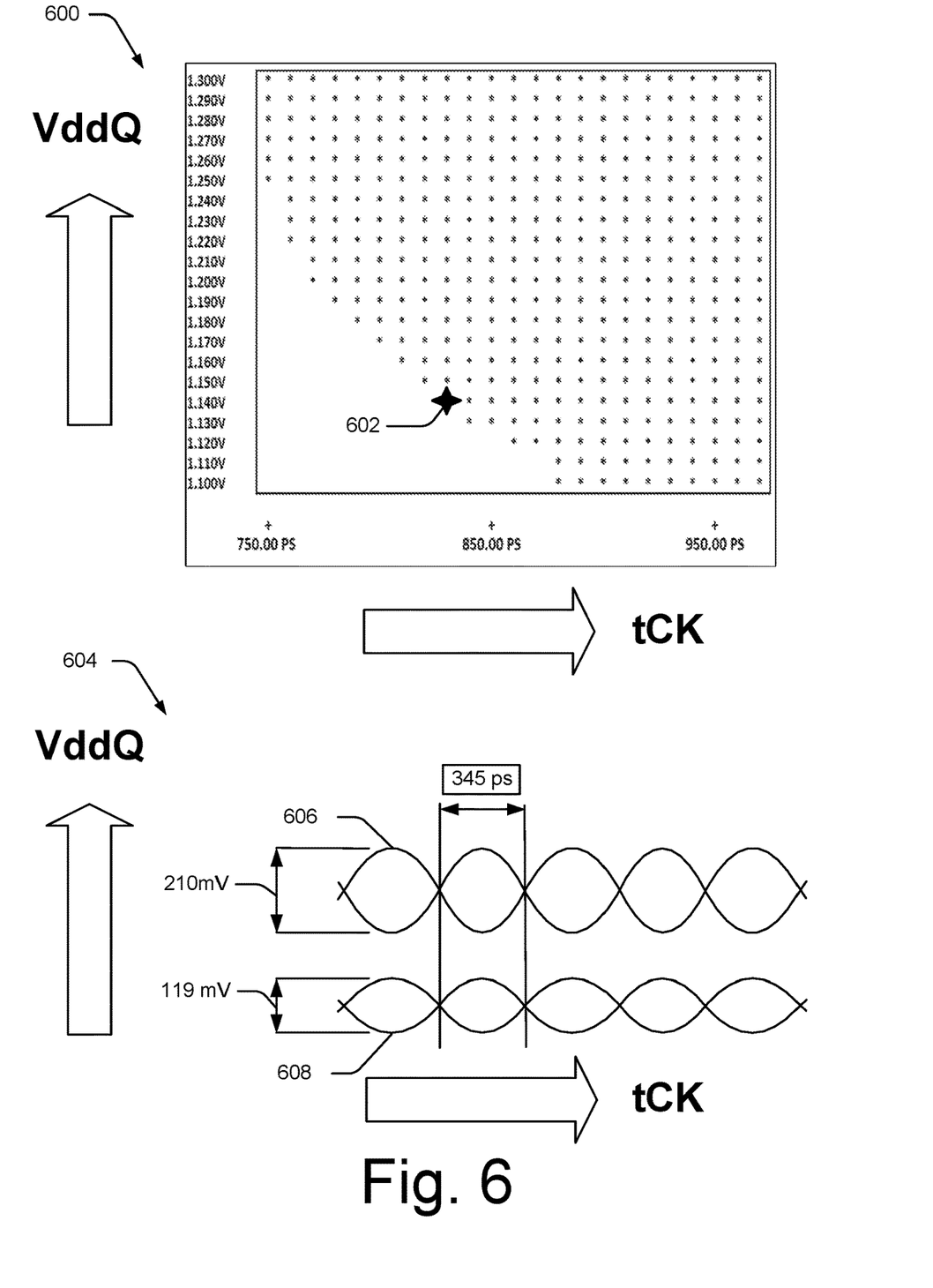
FIG. 6 illustrates example performance diagrams of a system-in-package implemented in accordance with aspects described herein.

FIG. 6 illustrates example performance diagrams of a system-in-package implemented in accordance with aspects described herein. Performance diagram 600 may, for example, represent performance of the die carrier to which an example DRAM die and an example application processor die are mounted of FIG. 5. FIG. 6 illustrates a voltage vs. frequency shmoo plot measured from test pads in 4-channel operation mode. As shown at data point 602, stable operation is enabled at Vdd2=1.14V and 1067 MHz clock frequency. Additionally, the measurement results show tCK vs Vdd2 operating window and tRCD and tRP of 9.4 ns and 9.1 ns, respectively, at Vdd2=1.2V.

Performance diagram 604 compares a first continuous read data-eye 606 at 2133 Mbps without DBIac enabled and a second continuous read data-eye 608 at 2133 Mbps with DBIac. These silicon data eye waveforms from a continuous, seamless read cycle highlight a 1.8× improvement (210 mV/119 mV) in eye height with DBIac enabled.

Table 2 summarizes the key array timings along with chip standby and active currents for critical operating modes.

TABLE 2

| 1.2 V/80 C | CHANNEL SILICON (ns) | 1.2 V/85 C | CHANNEL SILICON (mA) |
|---|---|---|---|
| tAA | 10.8 | Idd02 | 35.3 |
| tRCD | 9.4 | Idd2P2 | 0.053 |
| tRP(pb) | 9.1 | Idd4r2 | 275.2 |
| tRAS | 24.3 | Idd4r2 w/dbi | 279.3 |
| tRCD | 33.4 | Idd4w2 | 145.1 |
| tWR | 6.1 | Idd4w2 w/dbi | 156.4 |
| tRRD | 2.6 | Idd52 | 37.9 |
| tFAW | 11.6 | | |

Accordingly, a custom 1.2V 1 Gb design may be developed in and/or using 30 nm technology. The design may operate as a thirty-two (32) byte wide IO chip with four (4) independent channels each supporting eight (8) bytes. Such a design has been verified to operate up to 1067 MHz clock frequency at Vdd2=1.14V. An I/O power per bit of 2.5 mW/Gbps can be attained with the optimized bit-slice architecture and LVSIO techniques as described herein. Edge to edge DRAM to AP placement on next level of assembly may also result in 68 GBps data rate while using lower-cost packaging infrastructure.

Figure 7:
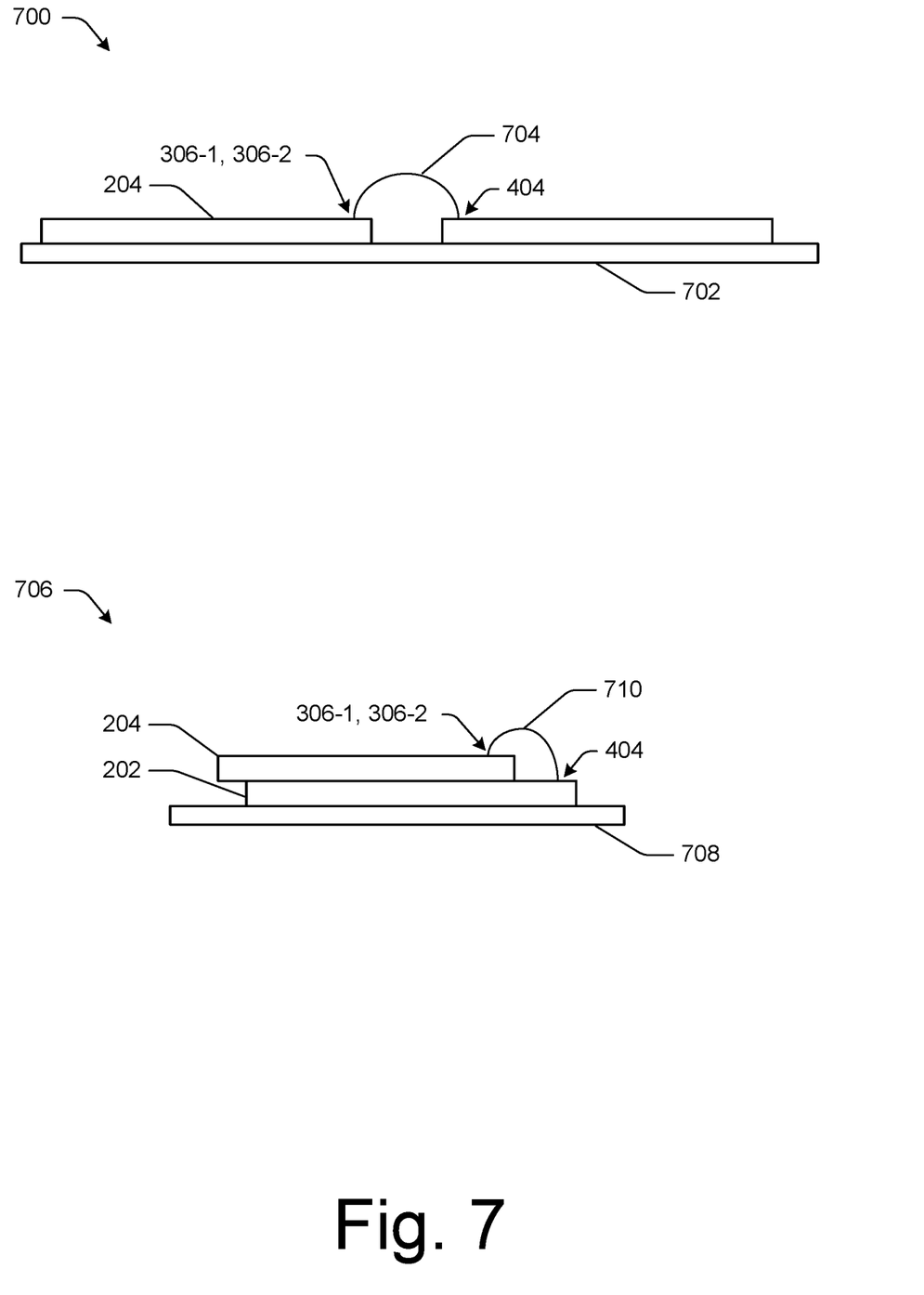
FIG. 7 illustrates an example method for mounting a DRAM die and an application processor die to a die carrier in accordance with one or more aspects.

FIG. 7 illustrates example, alternate configurations of a system-in-package containing a DRAM die and an AP die. Although floor-plan 300 of the DRAM die 204 and floor-plan 400 of the AP die 202 have been described in the context of mounting the DRAM die 204 and the AP die 202 to the die carrier 502, general architecture of the respective die floor-plans (e.g., 300 and 400) lend themselves to additional, alternate configurations. Such configurations may offer, to an end user, an acceptable cost-versus-performance tradeoff when compared to configurations obtained via (TSV) packaging construction techniques.

In general, a DRAM die (such as DRAM die 204) and an AP die (such as AP die 202) may be fixed to either a coplanar surface or to parallel surfaces in a fashion that still maintains respective LVSIO field locations adjacent to one another. However, as opposed to electrically connecting respective I/O's of the LVSIO fields via an RDL, respective I/Os may be electrically connected via wirebonds or the like. Doing so may, in certain instances, result in a data bus having acceptable parasitic performance characteristics for a particular end use application of the system-in-package (SiP).

Example configuration 700 illustrates the DRAM die 204 and the AP die 202 fixed to a common planar surface via a common substrate 702 (note, that in contrast to configuration 500 of FIG. 5, DRAM die 204 and AP die 202 are oriented "face up" in configuration 700). The substrate 702 may be, in some instances, fabricated from silicon or a printed circuit board (PCB) containing one or more layers of circuitry. The DRAM die 204 and the AP die 202 may be fixed to the surface using taping or other semiconductor packaging techniques. The fields of LVSIOs (e.g., 306-1, 306-2, and 404) are adjacent to one another and are connected, in this instance, via wirebonds 704 (note the absence of RDL and microbumps).

Example configuration 706 illustrates a cross-section of the DRAM die 204 and the AP die 202 fixed to differing planar surfaces which are parallel to one another. In this example configuration, the DRAM die 204 and AP die 202 are stacked on top of a substrate 708, which again may be fabricated from silicon or a PCB containing one or more layers of circuitry. The order of stacking (DRAM die 204 on top of AP die 202, or vice versa) is variable, but "shingling" must occur in order to expose the respective fields of LVSIOs (e.g., 306-1, 306-2, and 404) such that connection via wirebonds, such as wirebonds 710, may occur. Doing so may, in certain instances, result in a data bus having acceptable parasitic performance characteristics for a particular end use application of the system-in-package (SiP).

Example Method

Figure 8:
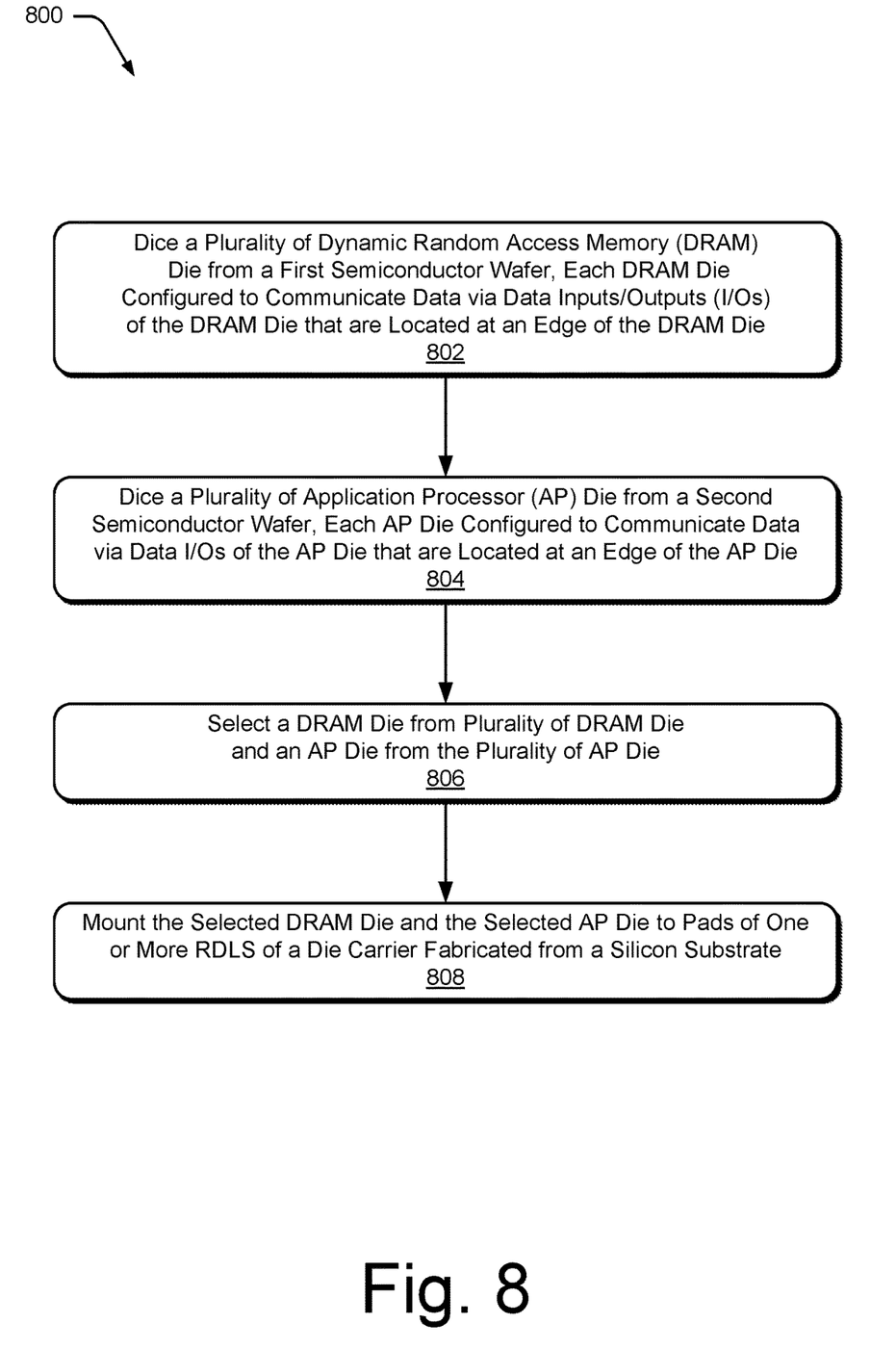
FIG. 8 illustrates example, alternate configurations of a DRAM die and an AP die in a system-in-package.

FIG. 8 illustrates an example method 800 for mounting a DRAM die and an application processor die to a die carrier. This method is shown as sets of blocks that specify operations performed but are not necessarily limited to the order or combinations shown for performing the operations by the respective blocks. For example, operations of different methods may be combined, in any order, to implement alternate methods without departing from the concepts described herein. In portions of the following discussion, the techniques may be described in reference to FIGS. 2-5 though reference to which is made for example only. The techniques are not limited to performance by one entity or multiple entities operating on one device, or those described in these figures.

At 802, a plurality of dynamic random access memory (DRAM) die are diced from a first semiconductor wafer. Each of the plurality of DRAM die is configured to communicate data via data inputs/outputs located at an edge of the DRAM die. The DRAM die may be the DRAM die 204 of FIG. 2 having a floor-plan corresponding to floor-plan 300 of FIG. 3. Dicing may be accomplished through a dicing process such as laser dicing, sawing, and the like.

At 804, a plurality of application processor (AP) die are diced from a second semiconductor wafer. Each of the plurality of AP die is configured to transmit and receive data via data inputs/outputs located near an edge of the AP die. The AP die may be the AP die 202 of FIG. 2 having a floor-plan corresponding to floor-plan 400 of FIG. 4. Dicing may be accomplished as noted above.

At 806, a DRAM die is selected from the plurality of DRAM Die and an AP die is selected from the plurality of AP die. The selection of DRAM die may be based, at least in part, on test data collected via test pads located on the DRAM die. The DRAM die, as well as the AP die, may also be selected based on identifiers associated with a semiconductor inking or marking process.

At 808, the selected DRAM die and selected AP die are mounted to pads of one or more RDLs of a die carrier fabricated from a silicon substrate. The die may be mounted to the pads via microbumps, comprised of microbumps such as 306, 308, 316, and 318 of FIG. 3 and microbumps 406 and 412 of FIG. 4. Mounting processes may rely on, for example, thermal compression, reflow, or another semiconductor manufacturing process specific to a microbump material that results in the microbumps adhering to the pads of the one or more RDLs. Additionally, mounting processes may further result in edges of the selected DRAM die and edges of the selected AP die being mounted adjacent to one another, as illustrated by the boundaries 514 and 516 shown in FIG. 5.

Figure 9:
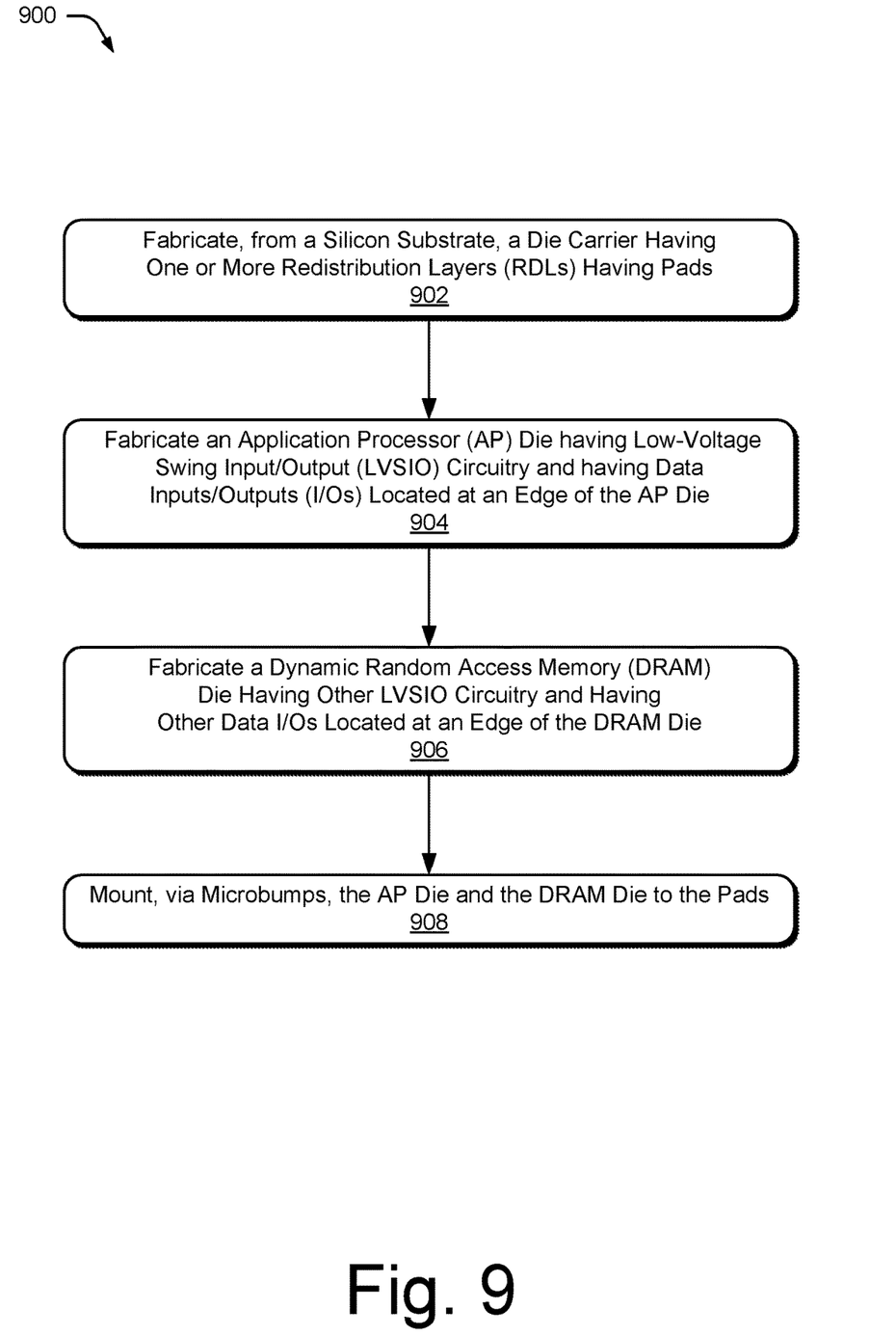
FIG. 9 illustrates an example method for integrating a DRAM die with an application processor die.

FIG. 9 illustrates an example method 900 for integrating a DRAM die with an application processor die. This method is shown as sets of blocks that specify operations performed but are not necessarily limited to the order or combinations shown for performing the operations by the respective blocks. For example, operations of different methods may be combined, in any order, to implement alternate methods without departing from the concepts described herein. In portions of the following discussion, the techniques may be described in reference to FIGS. 3-5, though reference to which is made for example only. The techniques are not limited to performance by one entity or multiple entities operating on one device, or those described in these figures.

At 902, a die carrier is fabricated from a silicon substrate. The die carrier is fabricated to have one or more redistribution layers (RDLs), each layer of which includes respective traces. In some instances, the die carrier may be the die carrier 502 of FIG. 5 and the first RDL may be the RDL 504 of FIG. 5, including traces such as trace 512 and pads such as pad 508 and 510. As part of 902, a second RDL that is a power plane may also be fabricated. Furthermore, any RDL of the one or more RDL's may be fanned out.

At 904, an application processor (AP) die having low-voltage swing input/output (LVSIO) circuitry and having data inputs/outputs located at an edge of the AP die is fabricated. In some cases, the AP die is the AP die 202 of FIG. 2 and has a floor-plan in accordance with floor-plan 400 FIG. 4.

At 906, a dynamic random access memory (DRAM) die having other LVSIO circuitry and other data inputs/outputs located at an edge of the DRAM die is fabricated. In some instances, the DRAM die is the DRAM die 204 of FIG. 2 and has a floor-plan in accordance with floor-plan 300 of FIG. 3.

At 908, the AP die and the DRAM die are mounted to the pads of the one or more RDLs of the die carrier. In some cases, the fields of microbumps may be the fields of LVSIOs 404 and fields of interconnects 410-1 through 410-3 of FIG. 4 and the other fields of microbumps may be the fields of LVSIOs 306-1, 306-2, 312-1, 312-2, and 316-1 through 316-6 of FIG. 3. The microbump pads of the one or more RDLs may include, at least in part, pads 508 and 510 of FIG. 5.

Example System-in-Package

Figure 10:
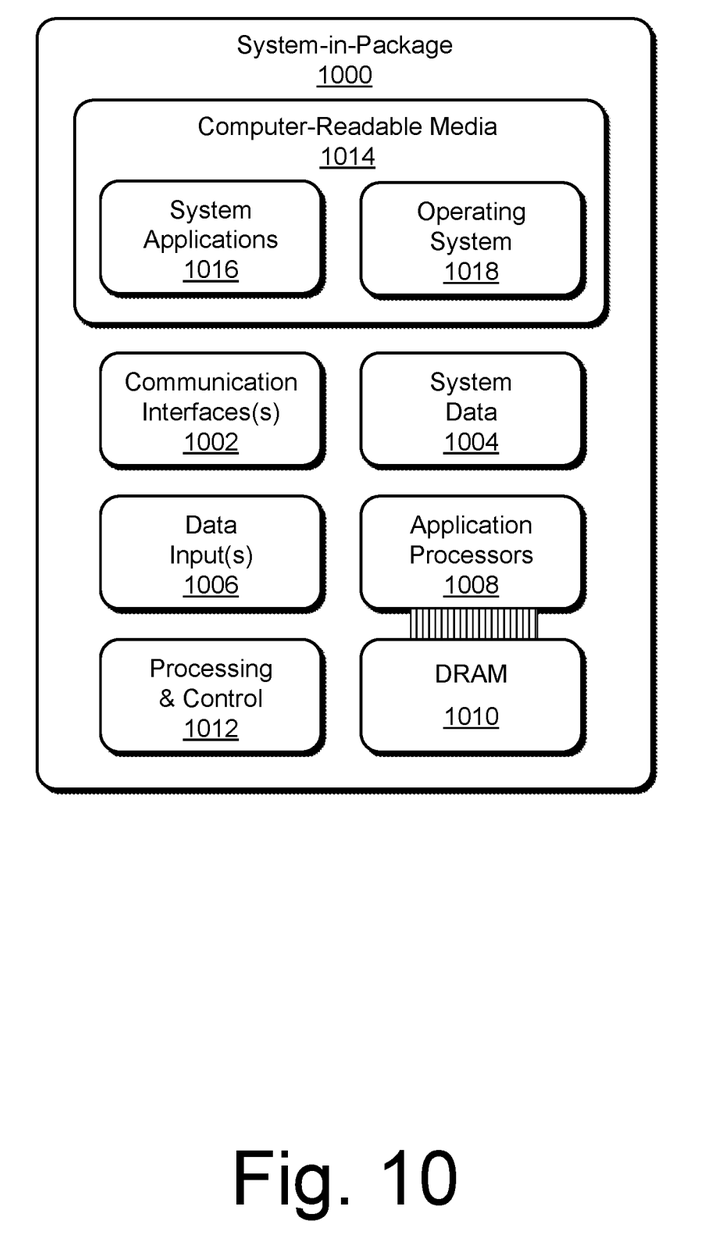
FIG. 10 illustrates an example System-in-Package in which a DRAM die and AP die may be integrated in accordance with one or more aspects.

FIG. 10 illustrates various elements of an example system-in-package (SiP) 1000 that can be embodied in any type of client, server, and/or computing device as described with reference to the previous FIGS. 1-8. The system-in-package 1000 includes a combination components of integrated circuitry in die or other form, including circuitry that may be integrated as part of a system-on-chip (SoC) die, to form the system-in-package 1000. Interconnects within the system-in-package 1000 may rely on combinations of package assembly technologies, including wirebonding to electrical pads, use of microbumps, and the like.

The components include communication interfaces 1002 that enables communication of system data 1004 (e.g., received data, data that is being received, data scheduled for broadcast, data packets of the data, etc.). The communication interfaces may be implemented as controllers for any one or more of a serial and/or parallel interface, a wireless interface, any type of network interface, a modem, and as any other type of communication interface. System data 1004 or other system content can include configuration settings of the system, media content stored on the system, and/or information associated with a user of the system. Media content stored on the System-in-Package 1000 can include any type of audio, video, and/or image data. The system-in-package 1000 includes one or more data inputs 1006 via which any type of data, media content, and/or inputs can be received, such as messages, music, television media content, recorded video content, and any other type of audio, video, and/or image data received from any content and/or data source.

Also included are one or more application processors 1008 (e.g., any of microprocessors, controllers, and the like), which process various computer-executable instructions to control the operation of the system-in-package 1000. The system-in-package also includes DRAM 1010, which may be connected to respective ones of the application processors 1008 and/or placed adjacent to the application processors 1008 on a die carrier fabricated from silicon in accordance with methods described herein. Alternatively or in addition, the system-in-package 1000 can be implemented with any one or combination of hardware, firmware, or fixed logic circuitry that is implemented in connection with processing and control circuits, which are generally identified at 1012. Although not shown, the system-in-package 1000 can include a system bus or data transfer system that couples the various components within the system. A system bus can include any one or combination of different bus structures, such as a memory bus or memory controller, a peripheral bus, a universal serial bus, and/or a processor or local bus that utilizes any of a variety of bus architectures.

The system-in-package 1000 also includes other components that may be computer-readable media 1014, such as one or more memory devices that enable persistent and/or non-transitory data storage (i.e., in contrast to mere signal transmission), examples of which include non-volatile memory (e.g., any one or more of a read-only memory (ROM), flash memory, EPROM, EEPROM, etc.) and the like. The System-in-Package 1000 may also interface with a disk storage device implemented as any type of magnetic or optical storage device, such as a hard disk drive, a recordable and/or rewriteable compact disc (CD), any type of a digital versatile disc (DVD), and the like.

The computer-readable media 1014 provides data storage mechanisms to store the system data 1004, as well as various system applications 1016 and any other types of information and/or data related to operational aspects of the System-in-Package 1000. For example, an operating system 1018 can be maintained as software or firmware with the computer-readable media 1014 and executed on the application processors 1008.

CONCLUSION

Although techniques and apparatuses for integrated DRAM with low-voltage swing I/O have been described in language specific to features and/or methods, it is to be understood that the subject of the appended claims is not necessarily limited to the specific features or methods described. Rather, the specific features and methods are disclosed as example ways in which integrated DRAM with low-voltage swing I/O can be implemented.

I claim:

1. A system-in-package comprising:
    a die carrier, fabricated from silicon, having one or more redistribution layers (RDLs) of respective traces, each respective trace having a length that is less than 530 micrometers (um), the RDLs of the respective traces being configured to connect at least two integrated circuit die;
    an application processor (AP) die having Low-Voltage Swing Input/Output (LVSIO) circuitry configured to operate with an output stage logic power voltage of approximately 0.3 volts, the AP die mounted, via microbumps, to pads of the one or more RDLs of the die carrier; and
    a dynamic random access memory (DRAM) die having other LVSIO circuitry configured to operate with an output stage logic power voltage of approximately 0.3 volts, the DRAM die mounted, via other microbumps, to other pads of the one or more RDLs of the die carrier, the respective traces of the one or more RDLs providing a data bus between the DRAM die and the AP die.

2. The system-in-package as recited in claim 1, wherein:
    the respective traces of a first RDL of the one or more RDLs of the die carrier are configured as a data bus; and
    a second RDL of the one or more RDLs of the die carrier is configured as a power plane.

3. The system-in-package as recited in claim 1, wherein data inputs/outputs (I/Os) of the AP die are located within a first proximity of less than 530 um from an edge of the AP die and other data I/Os of the DRAM die are located within a second proximity of less than 530 um from an edge of the DRAM die.

4. The system-in-package as recited in claim 3, wherein the first proximity that is less than 530 um from the edge of the AP die and the second proximity that is less than 530 um from the edge of the DRAM die are different in magnitude relative to the respective edges of the AP die and the DRAM die.

5. The system-in-package as recited in claim 1, wherein the respective traces of the one or more RDLs that provide the data bus are un-terminated.

6. The system-in-package as recited in claim 1, wherein the DRAM die further comprises metallic test pads.

7. The system-in-package as recited in claim 1, wherein the respective traces of the one or more RDLs that provide the data bus are configured to support at least four channels of memory access.

8. The system-in-package as recited in claim 7, wherein each of the four channels of memory access is powered by a respective power distribution network.

9. The system-in-package as recited in claim 7, wherein each channel of the four channels of memory access supports an 8 byte wide data I/O.

10. The system-in-package as recited in claim 1, wherein the microbumps and the other microbumps use a copper (Cu) pillar technology.

11. The system-in-package as recited in claim 1, wherein the microbumps and the other microbumps use a thermal compression with non-conductive paste technology.

12. The system-in-package as recited in claim 1, wherein at least one of the other microbumps of the DRAM die is an outrigger microbump that does not provide any additional electrical connectivity between the DRAM die and the AP die.

13. The system-in-package as recited in claim 1, wherein the DRAM die includes built in self-test (BIST) circuitry.

14. The system-in-package as recited in claim 1, wherein the DRAM die is fabricated using a 30 nanometer (nm) technology and the AP die is fabricated using another technology.

15. A system-in-package comprising:
    an application processor (AP) die having Low Voltage Swing Input/Output (LVSIO) circuitry that is configured to operate with an output stage logic power voltage of approximately 0.3 volts and having data inputs/outputs (I/Os) located within a first proximity of less than 530 micrometers (um) from an edge of the AP die, the AP die fixed to a first planar surface;
    a dynamic random access memory (DRAM) die having other LVSIO circuitry that is configured to operate with an output stage logic power voltage of approximately 0.3 volts and having other data I/Os located within a second proximity of less than 530 um from an edge of the DRAM die, the DRAM die fixed to a second planar surface that is parallel to the first planar surface and such that the other data I/Os located within the second proximity of less than 530 um from the edge of the DRAM die are adjacent to the data I/Os located within the first proximity of less than 530 um from the edge of the AP die; and
    an electrical connection, the electrical connection connecting the data I/Os located within the first proximity of less than 530 um from the edge of the AP die and the other data I/Os located within the second proximity of less than 530 um from the edge of the DRAM die.

16. The system-in-package as recited in claim 15, wherein the first planar surface and the second planar surface are a same surface of a substrate.

17. The system-in-package as recited in claim 16, wherein the electrical connection is a wirebond.

18. The system-in-package as recited in claim 16, wherein the substrate is a silicon substrate.

19. The system-in-package as recited in claim 16, wherein the substrate is a printed circuit board (PCB).

20. The system-in-package as recited in claim 19, wherein the DRAM die and the AP die are fixed to the PCB using taping.

* * * * *